(12) United States Patent
Yun et al.

(10) Patent No.: US 11,175,343 B2
(45) Date of Patent: Nov. 16, 2021

(54) METHOD AND DEVICE FOR ESTIMATING REMAINING AVAILABLE ENERGY OF A POWER BATTERY

(71) Applicant: Contemporary Amperex Technology Co., Limited, Ningde (CN)

(72) Inventors: Qiang Yun, Ningde (CN); Yushuai Shi, Ningde (CN); Yanhua Lu, Ningde (CN)

(73) Assignee: Contemporary Amperex Technology Co., Limited, Ningde (CN)

(*) Notice: Subject to any disclaimer, the term of this patent is extended or adjusted under 35 U.S.C. 154(b) by 0 days.

(21) Appl. No.: 16/910,977

(22) Filed: Jun. 24, 2020

(65) Prior Publication Data

US 2020/0319257 A1  Oct. 8, 2020

Related U.S. Application Data

(62) Division of application No. 15/720,102, filed on Sep. 29, 2017, now Pat. No. 10,732,225.

(30) Foreign Application Priority Data

Oct. 13, 2016  (CN) .......................... 201610892586.6

(51) Int. Cl.
  *G01R 31/3842* (2019.01)
  *G01R 31/392* (2019.01)
  *G01R 31/36* (2020.01)
  *G01R 31/387* (2019.01)
  *G01R 31/367* (2019.01)
  *G01R 31/396* (2019.01)

(52) U.S. Cl.
  CPC ......... *G01R 31/387* (2019.01); *G01R 31/367* (2019.01); *G01R 31/3647* (2019.01); *G01R 31/3648* (2013.01); *G01R 31/3842* (2019.01); *G01R 31/392* (2019.01); *G01R 31/396* (2019.01)

(58) Field of Classification Search
  None
  See application file for complete search history.

(56) References Cited

U.S. PATENT DOCUMENTS 10,732,225 B2 * 8/2020 Yun ...................... G01R 31/385

* cited by examiner

*Primary Examiner* — Roy Y Yi
(74) *Attorney, Agent, or Firm* — Law Offices of Liaoteng Wang

(57) ABSTRACT

A method and device for estimating remaining available energy of a power battery is provided. The method includes: estimating, under current state, maximum available energy of a first cell with minimum State of Charge (SOC), and maximum available energy of a second cell with minimum of maximum available capability in the power battery; estimating remaining available energy of the first cell based on its maximum available energy and SOC, and estimating remaining available energy of the second cell based on its maximum available energy and SOC; and estimating the remaining available energy of the power battery based on the number of cells included in the power battery and the smaller one of the remaining available energy between the first and the second cell.

16 Claims, 4 Drawing Sheets

--- acquiring SOE corresponding to the SOC of the first or second cell based on a pre-calibrated correspondence between the SOC and SOE of the power battery — S1042-2 estimating the remaining available energy of the first or second cell based on the maximum available energy, the SOE, and discharge limit SOE of the first or second cell — S1044-2

METHOD AND DEVICE FOR ESTIMATING REMAINING AVAILABLE ENERGY OF A POWER BATTERY

CROSS REFERENCE TO RELATED APPLICATION

The present application is a divisional application of U.S. patent application Ser. No. 15/720,102, filed on Sep. 29, 2017 and entitled "METHOD AND DEVICE FOR ESTIMATING REMAINING AVAILABLE ENERGY OF A POWER BATTERY", which claims priority to Chinese Patent Application No. 201610892586.6, filed on Oct. 13, 2016, published as CN106329021A and entitled "METHOD AND DEVICE FOR ESTIMATING REMAINING AVAILABLE ENERGY OF A POWER BATTERY", the disclosures of which are each incorporated herein by reference in their entireties.

FIELD

The present disclosure generally relates to electronic and electrical engineering, and more particularly to a method and device for estimating remaining available energy of a power battery.

BACKGROUND

Facing the increasingly serious problems of energy shortage and environmental degradation, an electric vehicle such as an electric automobile and an electric motorcycle is widely concerned for its advantages, for example, low energy consumption, zero emission, low noise, high energy efficiency, simple structure, and ease of maintenance. However, travel range of the electric vehicle is generally short due to its limited power battery capacity, which causes inconvenience in daily use. To avoid the situation that the electric vehicle is not able to travel due to low power of its power battery, a driver of the electric vehicle need to know the remaining travel range of the electric vehicle, i.e., distance the electric vehicle may further travel, so as to charge the power battery of the electric vehicle in time, or choose a reasonable driving mode and travel path.

Estimation of remaining travel range of the electric vehicle includes two parts: estimation of remaining available energy of the power battery, and estimation of average energy consumption per kilometer of the electric vehicle. Thus, the remaining available energy of the power battery becomes gradually a state parameter of the power battery that a Battery Management System (BMS) must report to a Vehicle Control Unit (VCU).

SUMMARY

The present disclosure provides a novel method and device for estimating remaining available energy of a power battery.

The method for estimating remaining available energy of a power battery according to embodiments of the present disclosure may include: estimating, under current state, maximum available energy of a first cell with minimum State of Charge (SOC) and maximum available energy of a second cell with minimum of maximum available capability in the power battery; estimating remaining available energy of the first cell based on its maximum available energy and SOC, and estimating remaining available energy of the second cell based on its maximum available energy and SOC; and estimating the remaining available energy of the power battery based on the number of cells included in the power battery and the smaller one of the remaining available energy between the first and the second cell.

The device for estimating remaining available energy of a power battery according to embodiments of the present disclosure may include: a maximum available energy estimating unit configured to estimate, under current state, maximum available energy of a first cell with minimum State of Charge (SOC) and maximum available energy of a second cell with minimum of maximum available capability in the power battery; a cell remaining energy estimating unit configured to estimate remaining available energy of the first cell based on the maximum available energy and the SOC of the first cell, and estimating remaining available energy of the second cell based on the maximum available energy and the SOC of the second cell; and a battery remaining energy estimating unit configured to estimate the remaining available energy of the power battery based on the number of cells included in the power battery and the smaller one of the remaining available energy between the first and the second cell.

BRIEF DESCRIPTION OF THE DRAWINGS

Other features, aims, and advantages of the present disclosure will become more apparent by reading the following detailed description of non-limiting embodiments with reference to the appended drawings, in which the same or similar numerals represent the same or similar features.

DETAILED DESCRIPTION

Figure 1:
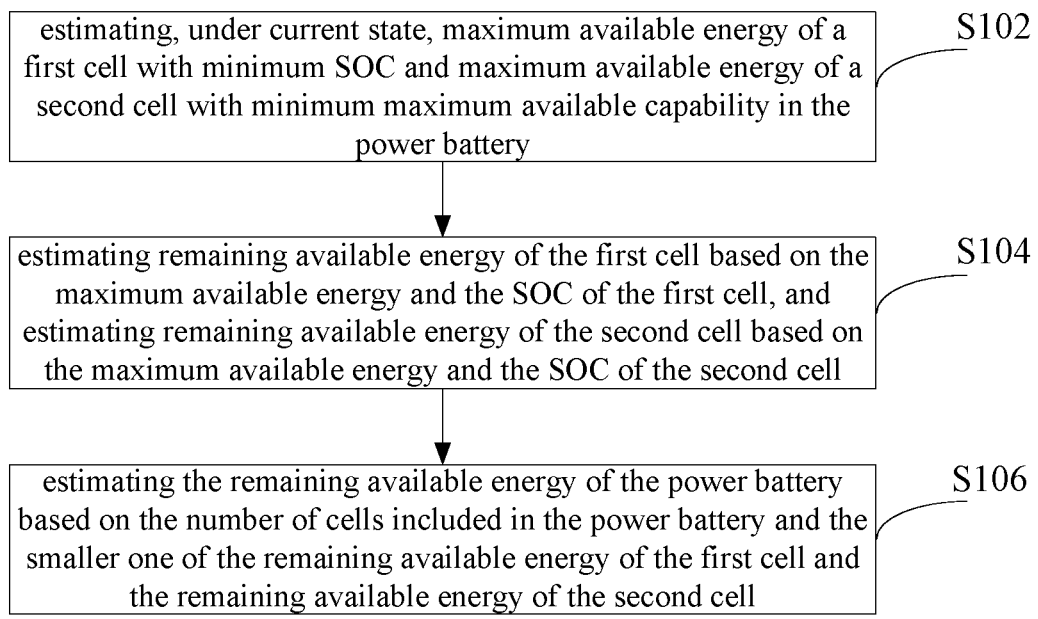
FIG. 1 illustrates a flow chart of a method for estimating remaining available energy of a power battery according to embodiments of the present disclosure.

Features of various aspects and exemplary embodiments of the present disclosure will be described in detail below. In the following detailed description, many specific details are disclosed to provide a thorough understanding of the present disclosure. However, it is apparent to a person skilled in the art that the present disclosure may be practiced without some of these specific details. The following descriptions of embodiments are merely to provide a better understanding of the present disclosure through illustrating examples of the present disclosure. The present disclosure is by no means limited to any specific configuration and algorithm disclosed below, but rather covering any modification, substitution, and improvement of elements, components, and algorithms without departing from the spirit of the present disclosure. In the appended drawings and the following descriptions, well-known structures and techniques are not illustrated to avoid unnecessarily obscuring the present disclosure.

Remaining available energy of a power battery may be affected by its operating condition and environment, which may vary greatly under different use situations. Remaining available energy of a power battery at some moment may refer to the energy that may be released cumulatively by the power battery, under some operating condition, from the current moment to the end of discharge moment. There are many factors that may affect the remaining available energy of the power battery, for example, State of Charge (SOC), charge-discharge condition, battery temperature, battery aging degree, inconsistence in maximum available capability of individual cells in the battery, imbalance in SOC of individual cells in the battery, all of which may affect the remaining available energy of the power battery.

Currently, there are the following three methods for estimating remaining available energy of a power battery: 1) estimating charge energy and discharge energy of the power battery with formula $E=\int_0^t U \cdot I \cdot t$, and estimating the remaining available energy of the power battery through subtracting the charge energy by the discharge energy, wherein E represents the charge/discharge energy of the power battery, and U and I represents charge/discharge voltage and charge/discharge current of the power battery, respectively; 2) estimating the remaining available energy of the power battery with formula $E=(SOC_{real}-SOC_{end}) \cdot C_{batt} \cdot U_{avg}$, wherein E represents the remaining available energy of the power battery, $C_{batt}$ represents maximum capability of the power battery, $U_{avg}$ represents average voltage of the power battery for a future pre-set time period, $SOC_{real}$ represents real SOC of the power battery, and $SOC_{end}$ represents use-limit SOC of the power battery (which relates to battery temperature of the power battery); 3) estimating, with current SOC of the power battery, remaining available capability of the power battery as the remaining available energy of the power battery.

However, there are various disadvantages in the aforementioned three methods. For example, in method 1), current sampling error and voltage sampling error may affect estimation results of the remaining available energy of the power battery, and moreover, impact of future discharge condition and battery temperature of the power battery on the remaining available energy of the power battery is not considered; in method 2), impact of future discharge condition and battery temperature of the power battery on the remaining available energy of the power battery has been considered, however, impact of inconsistence in the maximum available capability and imbalance in the SOC of individual cells in the power battery on the remaining available energy of the power battery is not considered; and in method 3), the remaining available capability and the remaining available energy of the power battery are two different physical quantities which may be unequal under many circumstances, for example, increasing the number of individual cells cascaded in the power battery may enhance the remaining available energy of the power battery, while the remaining available capability of the power battery may remain unchanged under this circumstance.

The present disclosure provides a novel method and device for estimating remaining available energy of a power battery. Below, the method and device for estimating remaining available energy of a power battery according to embodiments of the present disclosure is described in detail in conjunction with the appended drawings.

FIG. 1 illustrates a flow chart of a method for estimating remaining available energy of a power battery according to embodiments of the present disclosure. As shown in FIG. 1, the method for estimating remaining available energy of a power battery may include following operations. At S102, maximum available energy of a first cell with minimum SOC and maximum available energy of a second cell with minimum of maximum available capability in the power battery under current state are estimated. At S104, remaining available energy of the first cell is estimated based on the maximum available energy and the SOC of the first cell, and remaining available energy of the second cell is estimated based on the maximum available energy and the SOC of the second cell. At S106, the remaining available energy of the power battery is estimated based on the number of cells included in the power battery and the smaller one of the remaining available energy between the first cell and the second cell. Here, the SOC and the maximum available capability of cells in the power battery may generally be estimated by the BMS in real time, and thereby may be acquired from the BMS directly.

In some embodiments, for any of the first and second cells, product of the charging voltage U and the charging current I during constant current charging process of the cell may be integrated over time t according to equation (1) to estimate the maximum available energy E of the cell.

$$E=\int_0^t U \cdot I \cdot t \quad (1)$$

The charging voltage and the charging current of the power battery may be acquired from the BMS directly. The charging current I of any of the first and second cells may be calculated through dividing the charging current of the power battery by the number of parallel branches included in the power battery. The charging voltage U of any of the first and second cells may be acquired from the BMS directly.

In some embodiments, the remaining available energy of the first cell may be estimated by multiplying the maximum available energy $E_{SOCMin}$ by the SOC $SOC_{SOCMin}$ of the first cell; and the remaining available energy of the second cell may be estimated by multiplying the maximum available energy $E_{CapMin}$ by the SOC $SOC_{CapMin}$ of the second cell. Then, the remaining available energy E(t) of the power battery may be estimated according to equation (2) through multiplying the smaller one of the remaining available energy between the first cell and the second cells by the number n of the cells included in the power battery.

$$E(t)=n \cdot Min[E_{SOCMin} \cdot SOC_{SOCMin}, E_{CapMin} \cdot SOC_{CapMin}] \quad (2)$$

Here, the maximum available capability of cells in the power battery is estimated by the BMS in real time, which may reflect capability aging and attenuation condition of the cells, thus in the method for estimating remaining available energy of a power battery according to embodiments of the present disclosure, inconsistence in aging status of individual cells in the power battery (i.e., inconsistence in maximum available capability of the cells) is taken into consideration.

In the method for estimating remaining available energy of a power battery according to embodiments of the present disclosure, the remaining available energy of the whole power battery may be estimated with consideration of the impact of inconsistence in the maximum available capability and imbalance in the SOC of individual cells in the power battery on the remaining available energy of the power battery and by taking the cell with smaller remaining available energy between the first cell with minimum SOC and the second cell with minimum of maximum available capability in the power battery as a benchmark, thus the estimated results may be more accurate.

In some embodiments, for any of the first and second cells, the maximum available energy of the cell may also be estimated through multiplying the maximum available capability of the cell by capability-energy conversion coefficient K of the power battery. The capability-energy conversion coefficient K may be calibrated by offline tests.

Figure 2:
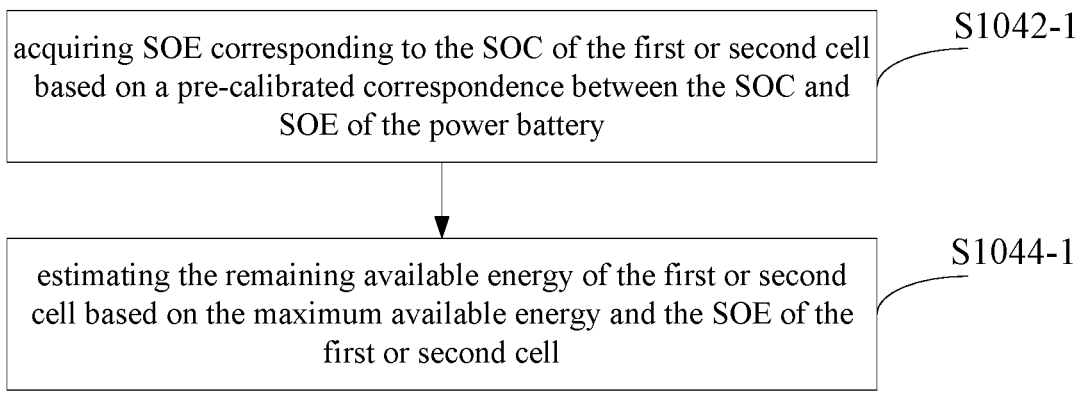
FIG. 2 illustrates a first example flow chart of process for estimating remaining available energy of a first or second cell.

While the SOC of the cell may reflect its State of Energy (SOE) to some extent, the SOC and the SOE of the cell may be not equal totally. Conversion relationship between the SOC and the SOE may relate to various factors such as operating condition, battery temperature, battery aging status of the power battery and the like. Thus, in some embodiments, as shown in FIG. 2, the process of estimation of the remaining available energy of the first or second cell may further include following operations. At S1042-1, SOE corresponding to the SOC of the first or second cell is acquired based on a pre-calibrated correspondence between the SOC and the SOE of the power battery. At S1044-1, the remaining available energy of the first or second cell is estimated based on the maximum available energy and the SOE of the first or second cell.

Here, the remaining available energy of the first cell may be estimated through multiplying the maximum available energy $E_{SOCMin}$ by the SOE $SOE_{SOCMin}$ of the first cell; and the remaining available energy of the second cell may be estimated through multiplying the maximum available energy $E_{CapMin}$ by the SOE $SOE_{CapMin}$ of the second cell. Then, the remaining available energy E(t) of the power battery may be estimated according to equation (3) through multiplying the smaller one of the remaining available energy between the first cell and the second cell by the number n of cells included in the power battery.

$$E(t)=n \cdot \text{Min}[E_{SOCMin} \cdot SOE_{SOCMin}; E_{CapMin} \cdot SOE_{CapMin}] \quad (3)$$

Compared with the above described embodiment in which the remaining available energy of the first and second cells is estimated based on the maximum available energy and the SOC of the first and second cells and the remaining available energy of the power battery is estimated thereby, more accurate estimated results may be acquired by the embodiment in which the SOE of the first and second cells is estimated based on the SOC of the first and second cells, then the remaining available energy of the first and second cells is estimated based on the maximum available energy and the SOE of the first and second cells, and thereby the remaining available energy of the power battery is estimated.

Figure 3:
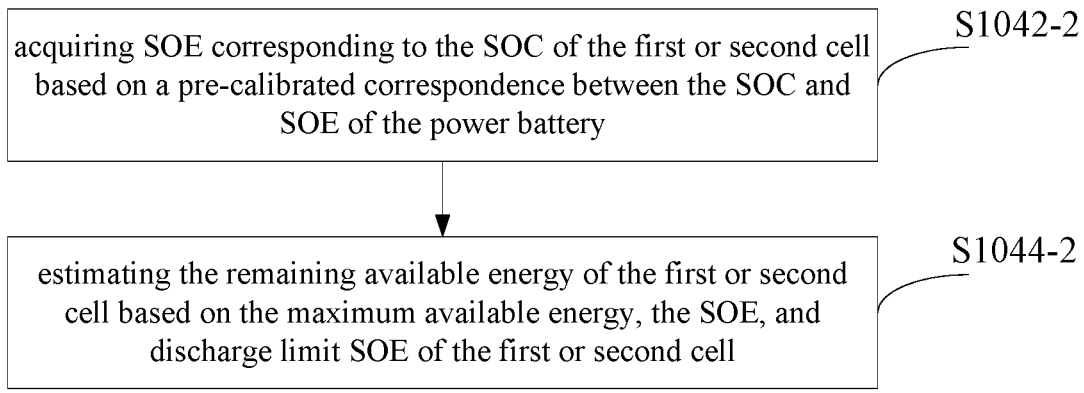
FIG. 3 illustrates a second example flow chart of process for estimating remaining available energy of a first or second cell.

Each cell in the power battery may have its own end of discharge point, however, in the above described embodiments, the end of discharge of the first and second cells is not considered, but rather the remaining available energy of the first and second cells is estimated based on only the maximum available energy and the SOC, or the maximum available energy and the SOE of the first and second cells, thus, the estimated results in the above described embodiments may not be accurate. In view of this, in some embodiments, as shown in FIG. 3, the process of estimation of the remaining available energy of the first or second cell may further include following operations. At S1042-2, the SOE corresponding to the SOC of the first or second cell is acquired based on the pre-calibrated correspondence between the SOC and the SOE of the power battery. At S1044-2, the remaining available energy of the first or second cell is estimated based on the maximum available energy, the SOE, and the end of discharge SOE of the first or second cell.

Here, the SOE $SOE_{SOCMin}$ subtracted by the end of discharge $SOE_{SOCLimit}$ of the first cell may arrive at the remaining available SOE ($SOE_{SOCMin} - SOE_{SOCLimit}$) of the first cell, and the remaining available energy of the first cell may be estimated through multiplying the maximum available energy $E_{SOCMin}$ by the remaining available SOE ($SOE_{SOCMin} - SOE_{SOCLimit}$) of the first cell. The SOE $SOE_{CapMin}$ subtracted by the end of discharge SOE $SOE_{CapLimit}$ of the second cell may arrive at the remaining available SOE ($SOE_{CapMin} - SOE_{CapLimit}$) of the second cell, and the remaining available energy of the second cell may be estimated through multiplying the maximum available energy $E_{CapMin}$ by the remaining available SOE ($SOE_{CapMin} - SOE_{CapLimit}$) of the second cell. Then, the remaining available energy E(t) of the power battery may be estimated according to equation (4) through multiplying the smaller one of the remaining available energy between the first cell and the second cell by the number n of cells included in the power battery.

$$E(t)=n \cdot \text{Min}[E_{SOCMin} \cdot (SOE_{SOCMin} - SOE_{SOCLimit}); E_{CapMin} \cdot (SOE_{CapMin} - SOE_{CapLimit})] \quad (4)$$

The end of discharge SOE of the first and second cells may be calibrated by offline tests, or estimated based on other electrical characteristics of the first and second cells calibrated by offline tests.

In some embodiments, the end of discharge SOE for any of the first and second cells may be estimated by: estimating the end of discharge open circuit voltage (OCV) of the cell based on discharge cut-off voltage, predicted average discharge current, and the direct current resistance at the end of discharge of the cell; acquiring the end of discharge SOC corresponding to the end of discharge OCV of the cell based on a pre-calibrated correspondence between the OCV and the SOC of the power battery; and acquiring the end of discharge SOE corresponding to the end of discharge SOC of the cell based on the pre-calibrated correspondence between the SOC and the SOE of the power battery. For example, the end of discharge OCV $OCV_{Limit}$ of the cell may be estimated according to equation (5) based on the discharge cut-off voltage $U_{Limit}$, the predicted average discharge current $I_{pre}$, and the direct current resistance at the end of discharge $R_{Low}(T, I_{pre})$ of the cell:

$$OCV_{Limit}=U_{Limit}+I_{pre} \cdot R_{Low}(T,I_{pre}) \quad (5)$$

In some embodiments, the following conversion relationship between the SOC and the SOE of the power battery may be estimated by offline tests and linear fitting:

$$SOE=a \cdot SOC^2+b \cdot SOC+c \quad (6)$$

In some embodiments, the discharge cut-off voltage for any of the first and second cells may be calibrated by offline tests. The predicted average discharge current for any of the first and second cells may be acquired through dividing the average discharge current of the power battery for a predetermined time period prior to the current moment by the number of parallel branches included in the power battery. The direct current resistance at the end of discharge for any of the first and second cells may be acquired from a correspondence table among the battery temperature, the predicted average discharge current, and the direct current resistance at the end of discharge of the power battery calibrated by offline tests, based on the current temperature and the predicted average discharge current of the cell.

In some embodiments, the predicted average discharge current for any of the first and second cells may be acquired by: acquiring, from the BMS, historical discharge current of the power battery for a pre-determined time period before the current moment; calculating average discharge current of the power battery for this pre-determined time period; acquiring the predicted average discharge current of the cell through dividing the average discharge current of the power battery for this pre-determined time period by the number of parallel branches included in the power battery.

In the above described embodiment, impact of change of the battery temperature and the discharge current of the power battery on the remaining available energy of the power battery has been further considered, and thus, the estimated results may be more accurate.

Figure 4:
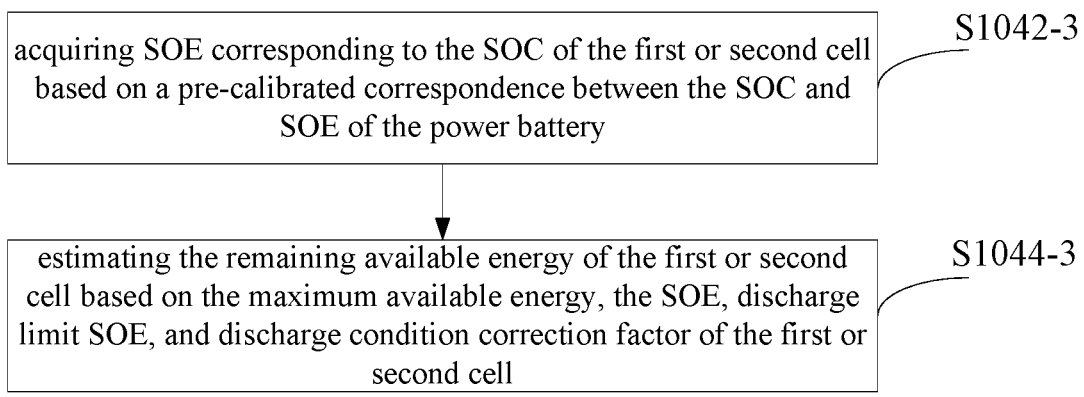
FIG. 4 illustrates a third example flow chart of process for estimating remaining available energy of a first or second cell.

As described above, the remaining available energy of the power battery may relate to not only the SOC, the battery temperature, the battery aging degree of the power battery, the inconsistence in the maximum available capability of individual cells in the battery, and the imbalance in the SOC of individual cells in the battery, but also charge-discharge condition of the power battery. In some embodiments, as shown in FIG. 4, the process of estimation of the remaining available energy of the first or second cell may further include: at S1042-3, the SOE corresponding to the SOC of the first or second cell is acquired based on the pre-calibrated correspondence between the SOC and the SOE of the power battery; and at S1044-3, the remaining available energy of the first or second cell is estimated based on the maximum available energy, the SOE, the end of discharge SOE, and discharge correction factor of the first or second cell.

Here, the SOE $SOE_{SOCMin}$ subtracted by the end of discharge SOE $SOE_{SOCLimit}$ of the first cell may arrive at the remaining available SOE ($SOE_{SOCMin}-SOE_{SOCLimit}$) of the first cell, and then the remaining available energy of the first cell may be estimated by multiplying the maximum available energy $E_{SOCMin}$ of the first cell by the remaining available SOE ($SOE_{SOCMin}-SOE_{SOCLimit}$) and the discharge correction factor $\eta_{SOCMin}$. The SOE $SOE_{CapMin}$ subtracted by the end of discharge SOE $SOE_{CapLimit}$ of the second cell may arrive at the remaining available SOE ($SOE_{CapMin}-SOE_{CapLimit}$) of the second cell, and then the remaining available energy of the second cell may be estimated by multiplying the maximum available energy $E_{CapMin}$ of the second cell by the remaining available SOE ($SOE_{CapMin}-SOE_{CapLimit}$) and the discharge correction factor $\eta_{CapMin}$. Then, the remaining available energy E(t) of the power battery may be estimated according to equation (7) by multiplying the smaller one of the remaining available energy between the first cell and the second cell by the number n of cells included in the power battery.

$$E(t) = n \cdot \text{Min}[E_{SOCMin} \cdot (SOE_{SOCMin}-SOE_{SOCLimit}) \cdot \eta_{SOCMin}, E_{CapMin} \cdot (SOE_{CapMin}-SOE_{CapLimit}) \cdot \eta_{CapMin}] \quad (7)$$

Here, the estimated results may be more accurate compared with the above described embodiments, as the factors such as the SOC, the battery temperature, the battery aging degree of the power battery, the inconsistence in the maximum available capability of individual cells in the battery, the imbalance in the SOC of individual cells in the battery, and the discharge condition have been considered.

Here, the discharge correction factor for any of the first and second cells may be estimated based on the end of discharge OCV, the predicted average discharge current, the average charge current, the direct current resistance in the middle of discharge, and the OCV corresponding to the SOC of the cell. The direct current resistance in the middle of discharge of the cell may be internal resistance of the cell when the SOC of the cell equal to 50%. For example, for any of the first and second cells, the discharge correction factor of the cell may be calculated according to equation (8) based on the discharge cut-off voltage $OCV_{Limit}$, the predicted average discharge current $I_{pre}$, the average charge current $I_{Chrg}$, the direct current resistance in the middle of discharge $R_{Mid}(SOC, T, I)$, and the OCV $OCV_{Min}$ corresponding to the SOC of the cell:

$$\eta = \frac{OCV_{Min} + OCV_{Limit} - 2I_{pre} \cdot R_{Mid}(SOC, T, I)}{OCV_{Min} + OCV_{Limit} - 2I_{Chrg} \cdot R_{Mid}(SOC, T, I)} \quad (8)$$

Here, the direct current resistance in the middle of discharge for any of the first and second cells may be acquired from a correspondence table among the SOC, the battery temperature, the predicted average discharge current, and the direct current resistance in the middle of discharge of the power battery calibrated by offline tests, based on the SOC, the current temperature, and the predicted average discharge current of the cell.

The method for estimating remaining available energy of a power battery according to embodiments of the present disclosure has been described above, and embodiments of a device for estimating remaining available energy of a power battery according to embodiments of the present disclosure will be described in detail in conjunction with the appended drawings below.

Figure 5:
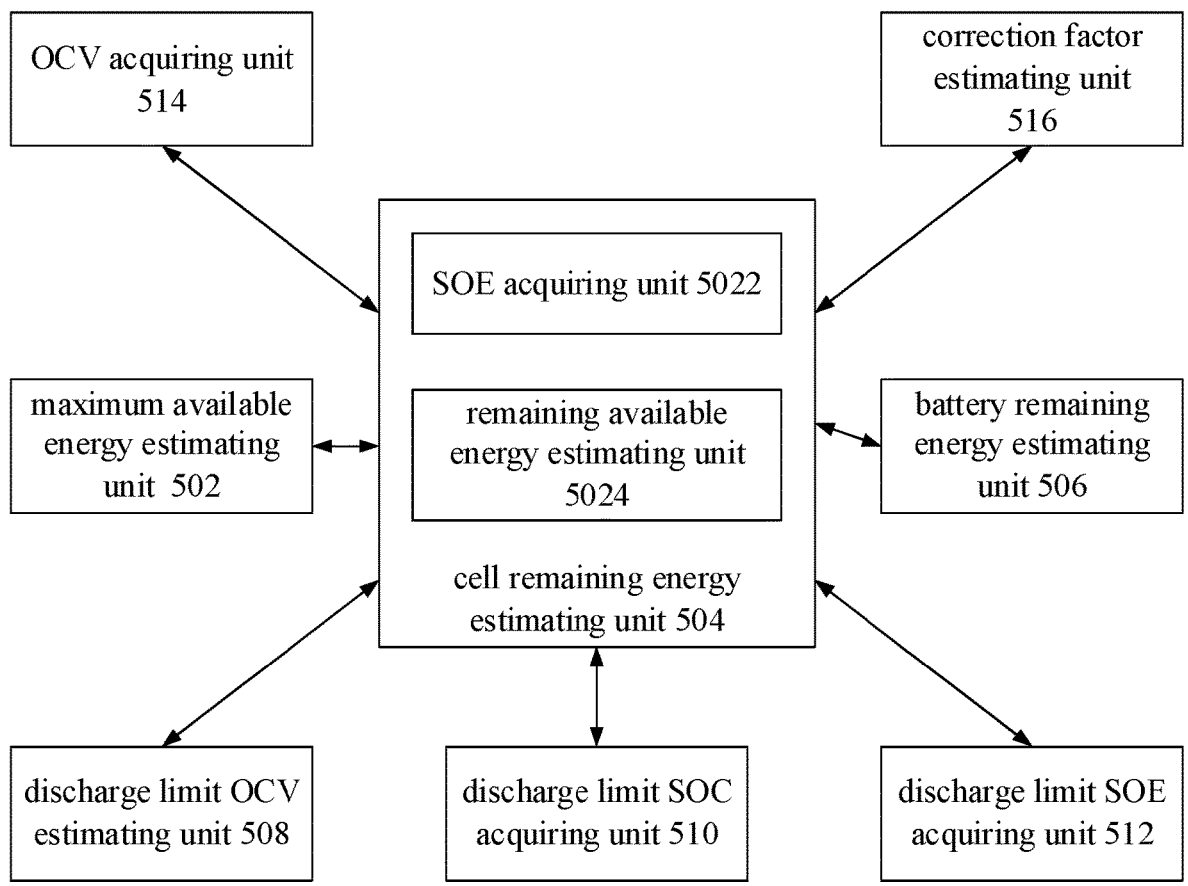
FIG. 5 illustrates a block diagram of a device for estimating remaining available energy of a power battery according to embodiments of the present disclosure.

FIG. 5 illustrates a block diagram of a device for estimating remaining available energy of a power battery according to embodiments of the present disclosure. As shown in FIG. 5, the device for estimating remaining available energy of a power battery may include a maximum available energy estimating unit 502, a cell remaining energy estimating unit 504, and a battery remaining energy estimating unit 506. The maximum available energy estimating unit 502 may be configured to estimate, under current state, maximum available energy of a first cell with minimum SOC and maximum available energy of a second cell with minimum of maximum available capability in the power battery (i.e., performing S102). The cell remaining energy estimating unit 504 may be configured to estimate remaining available energy of the first cell based on the maximum available energy and the SOC of the first cell, and estimate remaining available energy of the second cell based on the maximum available energy and the SOC of the second cell (i.e., performing S104). The battery remaining energy estimating unit 506 may be configured to estimate the remaining available energy of the power battery based on the number of cells included in the power battery and the smaller one of the remaining available energy between the first cell and the second cell (i.e., performing S106).

In some embodiments, the cell remaining energy estimating unit 504 may further include a SOE acquiring unit 5022 and a remaining available energy estimating unit 5024. The SOE acquiring unit 5022 may be configured to perform any of S1042-1 to S1042-3. The remaining available energy estimating unit 5024 may be configured to perform any of S1044-1 to S1044-3.

In some embodiments, the device for estimating remaining available energy of a power battery according to embodiments of the present disclosure may further include an end of discharge OCV estimating unit 508, an end of discharge SOC acquiring unit 510, and an end of discharge SOE acquiring unit 512. The end of discharge OCV estimating unit 508 may be configured to estimate the end of discharge OCV of the first or second cell based on discharge cut-off voltage, predicted average discharge current, and the direct current resistance at the end of discharge of the first or second cell. The end of discharge SOC acquiring unit 510 may be configured to acquire the end of discharge SOC corresponding to the end of discharge OCV of the first or second cell based on a pre-calibrated correspondence between OCV and the SOC of the power battery. The end of discharge SOE acquiring unit 512 may be configured to acquire the end of discharge SOE corresponding to the end of discharge SOC of the first or second cell based on a pre-calibrated correspondence between the SOC and the SOE of the power battery.

In some embodiments, the device for estimating remaining available energy of a power battery according to embodiments of the present disclosure may further include an OCV acquiring unit 514 and a correction factor estimating unit 516. The OCV acquiring unit 514 may be configured to acquire OCV corresponding to the SOC of the first or second cell based on the pre-calibrated correspondence between the OCV and the SOC of the power battery. The correction factor estimating unit 516 may be configured to estimate discharge correction factor of the first or second cell based on the end of discharge OCV, the predicted average discharge current, average charge current, the direct current resistance in the middle of discharge, and the OCV corresponding to the SOC of the first or second cell. The direct current resistance in the middle of discharge of the first or second cell may be internal resistance of the first or second cell when the SOC of the first or second cell is 50%.

Other details of the device for estimating remaining available energy of a power battery according to embodiments of the present disclosure are similar to those of the method for estimating remaining available energy of a power battery according to embodiments of the present disclosure described above in conjunction with FIGS. 1-4, and are omitted herein.

Figure 6:
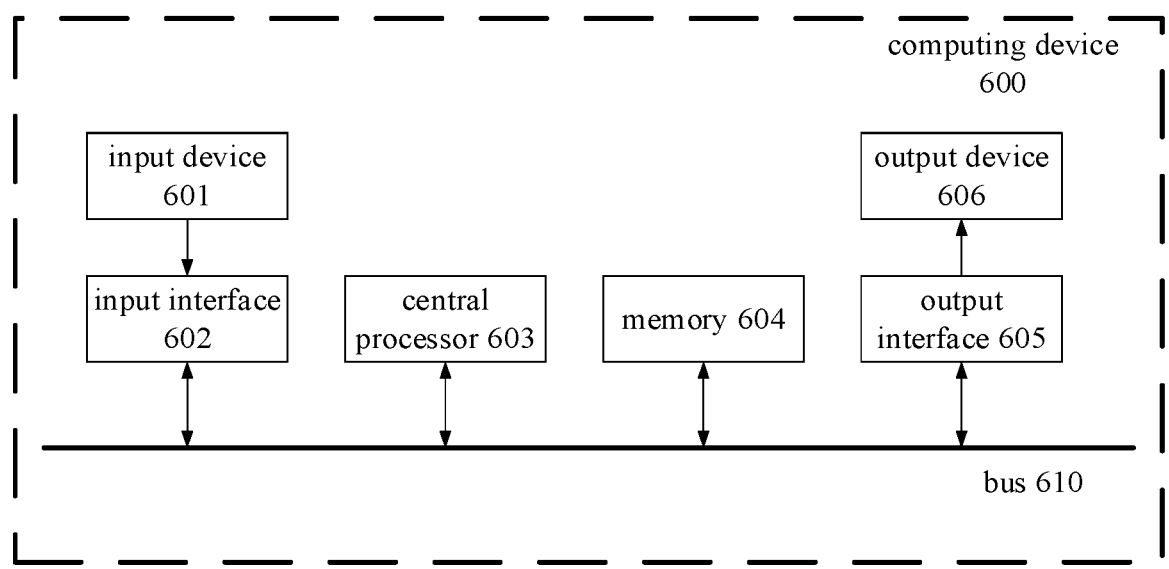
FIG. 6 illustrates a structure diagram of exemplary hardware architecture of a computing device in which the method and device for estimating remaining available energy of a power battery according to embodiments of the present disclosure may be implemented.

The method and device for estimating remaining available energy of a power battery according to embodiments of the present disclosure described in conjunction with FIG. 1-5 may be implemented by a computing device detachably or fixedly installed on the electric vehicle. FIG. 6 is a structure diagram illustrating exemplary hardware architecture of a computing device in which the method and device for estimating remaining available energy of a power battery according to embodiments of the present disclosure may be implemented. As shown in FIG. 6, the computing device 600 may include an input device 601, an input interface 602, a central processor 603, a memory 604, an output interface 605, and an output device 606. The input interface 602, the central processor 603, the memory 604, and the output interface 605 may be interconnected by a bus 610. The input device 601 and the output device 606 may be connected to the bus 610 via the input interface 602 and the output interface 605 respectively, and in turn connected to other components of the computing device 600. In particularly, the input device 601 may receive exterior input information (e.g., from sensors installed on a vehicle), and communicate the input information to the central processor 603 via the input interface 602. The central processor 603 may process the input information based on computer executable instructions stored in the memory 604 to generate output information, store the output information in the memory 604 temporarily or permanently, and then communicate the output information to the output device 606 via the output interface 605. The output device 606 may output the output information to the outside of the computing device 600 for use by a user.

In other words, the device for estimating remaining available energy of a power battery as shown in FIG. 6 may also be implemented as including: a memory on which computer executable instructions are stored; and a processor which may implement the method and device for estimating remaining available energy of a power battery described in conjunction with FIG. 1-5 when executing the computer executable instructions. Here, the processor may communicate with the BMS and temperature sensor installed on the power battery to execute the computer executable instructions based on related information from the BMS and/or the temperature sensor, so as to implement the method and device for estimating remaining available energy of a power battery described in conjunction with FIG. 1-5.

It should be noted that, the present disclosure is not limited to the specific configurations and processes described above and illustrated in the figures. For simplicity, detailed descriptions of well-known methods are omitted herein. In the aforementioned embodiments, a number of particular steps are described and illustrated as examples. However, method process of the present disclosure is not limited to the particular steps described and illustrated, and a person skilled in the art may make various changes, modifications, and additions, or change the order of the steps after understanding the spirit of the present disclosure.

Function blocks illustrated in the above described structure diagram may be implemented as hardware, software, firmware, or combination thereof. When implemented in hardware, it may be, for example, an electronic circuit, Application Specific Integrated Circuit (ASIC), appropriate firmware, plug-in, function card, and the like. When implemented in software, elements of the present disclosure may be programs or code segments used to perform tasks as required. The programs or code segments may be stored in machine readable medium, or communicated over transmission medium or communication links through data signals carried in carriers. The "machine readable medium" may include any medium that can store or communication information. Examples of machine readable medium may include: an electronic circuit, a semiconductor memory device, a ROM, a flash drive, an Erasable ROM (EROM), a floppy, a CD-ROM, an optical disk, a hard disk, optic fiber medium, a radio frequency (RF) link, etc. Code segments may be downloaded via computer networks such as the Internet, an intranet, etc.

The present disclosure may be implemented in other forms without departing from its spirit and essential feature. For example, algorithms described in specific embodiments may be modified, while system architecture dose not depart from the essential spirit of the present disclosure. Consequently, the current embodiments may be construed as exemplary and non-limiting examples in all aspects, and the scope of the present disclosure is defined by the appended claims rather than the above descriptions. Moreover, all changes falling within the scope of the definitions and equivalents of the claims are thereby included in the scope of the present disclosure.

What is claimed is:

1. A method for estimating remaining available energy of a power battery, comprising:
acquiring, by a battery management system (BMS), maximum available energy of a first cell;
acquiring, by the BMS, maximum available energy of a second cell; wherein the first cell is a cell with minimum state of charge (SOC) among cells in the power battery, wherein the second cell is a cell with minimum of maximum available capability among the cells in the power battery, wherein the cells in the power battery at least comprise the first cell and the second cell;

acquiring, by the BMS, end of discharge SOE of the first cell and end of discharge SOE of the second cell;

estimating, by the BMS, remaining available energy of the first cell based on the maximum available energy of the first cell, State of Energy (SOE) of the first cell corresponding to SOC of the first cell and the end of discharge SOE of the first cell;

estimating, by the BMS, remaining available energy of the second cell based on the maximum available energy of the second cell, State of Energy (SOE) of the second cell corresponding to SOC of the second cell and the end of discharge SOE of the first cell; and obtaining, by the BMS, remaining available energy of the power battery based on number of the cells in the power battery and a smaller remaining available energy between the remaining available energy of the first cell and the remaining available energy of the second cell, wherein the acquiring, by the BMS, the end of discharge SOE of the first cell and the end of discharge SOE of the second cell comprises:

estimating, by the BMS, end of discharge open circuit voltage (OCV) of the first cell based on discharge cut-off voltage of the first cell, predicted average discharge current of the first cell and direct current resistance at the end of discharge of the first cell;

acquiring, by the BMS, end of discharge SOC corresponding to the end of discharge OCV of the first cell;

acquiring, by the BMS, the end of discharge SOE corresponding to the end of discharge SOC of the first cell based on a pre-calibrated correspondence between SOCs and SOEs of the power battery;

estimating, by the BMS, end of discharge open circuit voltage (OCV) of the second cell based on discharge cut-off voltage of the second cell, predicted average discharge current of the second cell and direct current resistance at the end of discharge of the second cell;

acquiring, by the BMS, end of discharge SOC corresponding to the end of discharge OCV of the second cell; and acquiring, by the BMS, the end of discharge SOE corresponding to the end of discharge SOC of the second cell based on the pre-calibrated correspondence between SOCs and SOEs of the power battery, and wherein the direct current resistance at the end of discharge of the first cell is determined based on a current temperature of the first cell and the predicted average discharge current of the first cell, and the direct current resistance at the end of discharge of the second cell is determined based on a current temperature of the second cell and the predicted average discharge current of the second cell.

2. The method for estimating remaining available energy of a power battery of claim 1, wherein:

estimating, by the BMS, the remaining available energy of the first cell based on the maximum available energy of the first cell and the SOC of the first cell comprises:

acquiring, by the BMS, the State of Energy (SOE) of the first cell corresponding to the SOC of the first cell; and estimating, by the BMS, the remaining available energy of the first cell based on the maximum available energy of the first cell and the SOE of the first cell; and wherein estimating, by the BMS, the remaining available energy of the second based on the maximum available energy of the second cell and the SOC of the second cell comprises:

acquiring, by the BMS, the State of Energy (SOE) of the second cell corresponding to the SOC of the second cell;

estimating, by the BMS, the remaining available energy of the second cell based on the maximum available energy of the second cell and the SOE of the second cell.

3. The method for estimating remaining available energy of a power battery of claim 1, further comprising:

acquiring, by the BMS, discharge correction factor of the first cell and discharge correction factor of the second cell;

wherein estimating, by the BMS, the remaining available energy of the first cell based on the maximum available energy of the first cell, the SOE of the first cell and the end of discharge SOE of the first cell comprises:

estimating, by the BMS, the remaining available energy of the first cell based on the maximum available energy of the first cell, the SOE of the first cell, the end of discharge SOE of the first cell and the discharge correction factor of the first cell; and wherein estimating, by the BMS, the remaining available energy of the second cell based on the maximum available energy of the second cell, the SOE of the second cell and the end of discharge SOE of the second cell comprises:

estimating, by the BMS, the remaining available energy of the second cell based on the maximum available energy of the second cell, the SOE of the second cell, the end of discharge SOE of the second cell and the discharge correction factor of the second cell.

4. The method for estimating remaining available energy of a power battery of claim 3, wherein acquiring, by the BMS, discharge correction factor of the first cell and discharge correction factor of the second cell comprises:

acquiring, by the BMS, OCV corresponding to the SOC of the first cell;

estimating, by the BMS, discharge correction factor of the first cell based on end of discharge OCV of the first cell, predicted average discharge current of the first cell, average charge current of the first cell, direct current resistance in the middle of discharge of the first cell and the OCV corresponding to the SOC of the first cell; and acquiring, by the BMS, OCV corresponding to the SOC of the second cell;

estimating, by the BMS, discharge correction factor of the second cell based on end of discharge OCV of the second cell, predicted average discharge current of the second cell, average charge current of the second cell, direct current resistance in the middle of discharge of the second cell and the OCV corresponding to the SOC of the second cell.

5. The method for estimating remaining available energy of a power battery of claim 4, wherein the direct current resistance in the middle of discharge of the first cell is internal resistance when the SOC is 50%; and wherein the direct current resistance in the middle of discharge of the second cell is internal resistance when the SOC is 50%.

6. The method for estimating remaining available energy of a power battery of claim 1, further comprising:
acquiring, by the BMS, the predicted average discharge current of the first cell through dividing average discharge current for a pre-determined time period before a current moment by number of parallel branches included in the power battery; and
acquiring, by the BMS, the predicted average discharge current of the second cell through dividing the average discharge current for a pre-determined time period before the current moment by the number of parallel branches included in the power battery.

7. The method for estimating remaining available energy of a power battery of claim 1, further comprising:
acquiring, by the BMS, charging voltage of the power battery and charging current of the power battery;
wherein estimating, by the BMS, the maximum available energy of the first cell comprises:
estimating, by the BMS, the maximum available energy of the first cell based on the charging voltage of the power battery and the charging current of the power battery; and
wherein estimating, by the BMS, the maximum available energy of the second cell comprises:
estimating, by the BMS, the maximum available energy of the second cell based on the charging voltage of the power battery and the charging current of the power battery.

8. The method for estimating remaining available energy of a power battery of claim 1, wherein estimating, by the BMS, the maximum available energy of the first cell comprises:
estimating, by the BMS, the maximum available energy of the first cell through multiplying the maximum available capability of the first cell by a pre-calibrated capability-energy conversion coefficient K of the power battery; and
wherein estimating, by the BMS, the maximum available energy of the second cell comprises:
estimating, by the BMS, the maximum available energy of the second cell through multiplying the maximum available capability of the second cell by the pre-calibrated capability-energy conversion coefficient K of the power battery.

9. A device for estimating remaining available energy of a power battery, comprising:
a processor, and
a memory couple with the processor via an interface,
wherein the processor is configured to:
acquire maximum available energy of a first cell;
acquire maximum available energy of a second cell;
wherein the first cell is a cell with minimum state of charge (SOC) among cells in the power battery, wherein the second cell is a cell with minimum of maximum available capability among the cells in the power battery, wherein the cells in the power battery at least comprise the first cell and the second cell;
acquire end of discharge SOE of the first cell and end of discharge SOE of the second cell;
estimate remaining available energy of the first cell based on the maximum available energy of the first cell, State of Energy (SOE) of the first cell corresponding to SOC of the first cell and the end of discharge SOE of the first cell;
estimate remaining available energy of the second cell based on the maximum available energy of the second cell, State of Energy (SOE) of the second cell corresponding to SOC of the second cell and the end of discharge SOE of the second cell; and
obtain remaining available energy of the power battery based on number of the cells in the power battery and a smaller remaining available energy between the remaining available energy of the first cell and the remaining available energy of the second cell,
wherein the processor is further configured to:
estimate end of discharge open circuit voltage (OCV) of the first cell based on discharge cut-off voltage of the first cell, predicted average discharge current of the first cell and direct current resistance at the end of discharge of the first cell;
acquire end of discharge SOC corresponding to the end of discharge OCV of the first cell;
acquire the end of discharge SOE corresponding to the end of discharge SOC of the first cell based on a pre-calibrated correspondence between SOCs and SOEs of the power battery; and
estimate end of discharge open circuit voltage (OCV) of the second cell based on discharge cut-off voltage of the second cell, predicted average discharge current of the second cell and direct current resistance at the end of discharge of the second cell;
acquire end of discharge SOC corresponding to the end of discharge OCV of the second cell;
acquire the end of discharge SOE corresponding to the end of discharge SOC of the second cell based on the pre-calibrated correspondence between SOCs and SOEs of the power battery, and
wherein the direct current resistance at the end of discharge of the first cell is determined based on a current temperature of the first cell and the predicted average discharge current of the first cell, and the direct current resistance at the end of discharge of the second cell is determined based on a current temperature of the second cell and the predicted average discharge current of the second cell.

10. The device for estimating remaining available energy of a power battery of claim 9, wherein the processor is further configured to:
acquire the SOE of the first cell corresponding to the SOC of the first cell;
estimate the remaining available energy of the first cell based on the maximum available energy of the first cell and the SOE of the first cell;
acquire the SOE of the second cell corresponding to the SOC of the second cell; and
estimate the remaining available energy of the second cell based on the maximum available energy of the second cell and the SOE of the second cell.

11. The device for estimating remaining available energy of a power battery of claim 9, wherein the processor is further configured to:
acquire discharge correction factor of the first cell and discharge correction factor of the second cell;
estimate the remaining available energy of the first cell based on the maximum available energy of the first cell, the SOE of the first cell, the end of discharge SOE of the first cell and the discharge correction factor of the first cell; and
estimate the remaining available energy of the second cell based on the maximum available energy of the second cell, the SOE of the second cell, the end of discharge SOE of the second cell and the discharge correction factor of the second cell.

12. The device for estimating remaining available energy of a power battery of claim 11, wherein the processor is further configured to:
- acquire OCV corresponding to the SOC of the first cell;
- estimate discharge correction factor of the first cell based on end of discharge OCV of the first cell, predicted average discharge current of the first cell, average charge current of the first cell, direct current resistance in the middle of discharge of the first cell and the OCV corresponding to the SOC of the first cell; and
- acquire OCV corresponding to the SOC of the second cell;
- estimate discharge correction factor of the second cell based on end of discharge OCV of the second cell, predicted average discharge current of the second cell, average charge current of the second cell, direct current resistance in the middle of discharge of the second cell and the OCV corresponding to the SOC of the second cell.

13. The device for estimating remaining available energy of a power battery of claim 12, wherein the direct current resistance in the middle of discharge of the first cell is internal resistance when the SOC is 50%; and
- wherein the direct current resistance in the middle of discharge of the second cell is internal resistance when the SOC is 50%.

14. The device for estimating remaining available energy of a power battery of claim 9, wherein the processor is further configured to:
- acquire the predicted average discharge current of the first cell through dividing average discharge current for a pre-determined time period before a current moment by number of parallel branches included in the power battery; and
- acquire the predicted average discharge current of the second cell through dividing the average discharge current for a pre-determined time period before the current moment by the number of parallel branches included in the power battery.

15. The device for estimating remaining available energy of a power battery of claim 9, wherein the processor is further configured to:
- acquire charging voltage of the power battery and charging current of the power battery;
- estimate the maximum available energy of the first cell based on the charging voltage of the power battery and the charging current of the power battery; and
- estimate the maximum available energy of the second cell based on the charging voltage of the power battery and the charging current of the power battery.

16. The device for estimating remaining available energy of a power battery of claim 9, wherein the processor is further configured to:
- estimate the maximum available energy of the first cell through multiplying the maximum available capability of the first cell by a pre-calibrated capability-energy conversion coefficient K of the power battery; and
- estimate the maximum available energy of the second cell through multiplying the maximum available capability of the second cell by the pre-calibrated capability-energy conversion coefficient K of the power battery.

* * * * *